US012652795B2

(12) United States Patent　　　(10) Patent No.: US 12,652,795 B2
Gu et al.　　　(45) Date of Patent: Jun. 9, 2026

(54) DRAM TRANSISTOR INCLUDING BURIED BITLINE

(71) Applicant: Applied Materials, Inc., Santa Clara, CA (US)

(72) Inventors: Sipeng Gu, Clifton Park, NY (US); Qintao Zhang, Mt Kisco, NY (US)

(73) Assignee: Applied Materials, Inc., Santa Clara, CA (US)

( * ) Notice: Subject to any disclaimer, the term of this patent is extended or adjusted under 35 U.S.C. 154(b) by 441 days.

(21) Appl. No.: 18/174,375

(22) Filed: Feb. 24, 2023

(65) Prior Publication Data

US 2024/0292599 A1　　Aug. 29, 2024

(51) Int. Cl.
H10B 12/00　　(2023.01)
H10D 64/27　　(2025.01)

(52) U.S. Cl.
CPC ........... H10B 12/482 (2023.02); H10B 12/05 (2023.02); H10D 64/512 (2025.01)

(58) Field of Classification Search
CPC ..... H10B 12/482; H10B 12/05; H10D 64/512
See application file for complete search history.

(56) References Cited

U.S. PATENT DOCUMENTS

| | | | | |
|---|---|---|---|---|
| 6,841,438 B2 * | 1/2005 | Bissey | ................... | H10D 30/63 |
| | | | | 438/386 |
| 11,177,367 B2 | 11/2021 | Li et al. | | |

| | | | | |
|---|---|---|---|---|
| 2005/0199932 A1 * | 9/2005 | Abbott | ................. | H10B 12/395 |
| | | | | 438/269 |
| 2007/0087499 A1 * | 4/2007 | Seo | ........................ | H10D 89/10 |
| | | | | 257/E21.655 |
| 2008/0061337 A1 * | 3/2008 | Weis | .................... | H10D 64/027 |
| | | | | 257/E21.429 |
| 2011/0284942 A1 * | 11/2011 | Dong | .................... | H10D 30/60 |
| | | | | 257/E21.409 |
| 2021/0351188 A1 * | 11/2021 | Varghese | ............... | H10B 12/34 |
| 2024/0172419 A1 * | 5/2024 | Zhang | ................. | H10D 30/025 |
| 2024/0268095 A1 * | 8/2024 | Zhang | ................. | H10D 30/025 |

OTHER PUBLICATIONS

Chung et al. "Novel 4F2 DRAM Cell with Vertical Pillar Transistor(VPT)", pp. 211-214.
Date et al. "Suppression of the Floating-Body Effect Using SiGe Layers in Vertical Surrounding-Gate MOSFETs", IEEE Transactions on Electron Devices, vol. 48, No. 12, Dec. 2001, pp. 2684 2689.
Goebel et al., "Fully Depleted Surrounding Gate Transistor (SGT) for 70 nm DRAM and Beyond", pp. 275-278.

(Continued)

*Primary Examiner* — Tracie Y Green

(74) *Attorney, Agent, or Firm* — KDW Firm PLLC

(57) ABSTRACT

Disclosed herein are approaches for forming a dynamic random-access memory device (DRAM). An example DRAM device may include a plurality of pillars extending from a base of a substrate, a gate formed around the plurality of pillars, and a buried bitline formed within the base, wherein an upper surface of the buried bitline is recessed below an upper surface of the base. The DRAM device may further include a bottom source/drain formed beneath the plurality of pillars, and a contact formed in the bottom source/drain, between the plurality of pillars.

12 Claims, 7 Drawing Sheets

(56)      References Cited

OTHER PUBLICATIONS

Han et al., "Surround Gate Transistor With Epitaxially Grown Si Pillar and Simulation Study on Soft Error and Rowhammer Tolerance for DRAM", IEEE Transactions on Electron Devices, vol. 68, No. 2, Feb. 2021, pp. 529-534.

Yoshimi et al., "Suppression of the Floating-Body Effect in SOI MOSFET's by the Bandgap Engineering Method Using a Si 1-X Gex Source Structure", IEEE Transactions on Electron Devices, vol. 44, No. 3, Mar. 1997, pp. 423-430.

* cited by examiner

DRAM TRANSISTOR INCLUDING BURIED BITLINE

FIELD OF THE DISCLOSURE

The present disclosure relates to semiconductor structures and, more particularly, to a dynamic random-access memory (DRAM) transistor including a buried bitline.

BACKGROUND OF THE DISCLOSURE

As dynamic random-access memory (DRAM) devices scale to smaller dimensions, an increasing emphasis is placed on patterning for forming three dimensional structures, including trenches for storage nodes as well as access transistors. In current DRAM devices, transistors may be formed using narrow and tall, vertical semiconductor fin structures, often made from monocrystalline silicon. In accordance with current trends, the aspect ratio of such fin structures, meaning the height (depth) of a fin divided by the spacing between adjacent fins, may reach 20:1 or more in the coming years.

In an effort to continue scaling smaller, $4F^2$ DRAM devices have been developed. However, floating body effect (off current) and high common bitline (BL) resistance are challenges for current $4F^2$ vertical DRAM device design. The off-leakage current is caused by the floating body effect caused by hole accumulation into the body of the $4F^2$ DRAM device.

It is with respect to these and other drawbacks of the current art that the present disclosure is provided.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one aspect, a dynamic random-access memory device may include a plurality of pillars extending from a base, a gate formed around the plurality of pillars, and a buried bitline formed within the base, wherein an upper surface of the buried bitline is recessed below an upper surface of the base. The dynamic random-access memory device may further include a bottom source/drain formed beneath the plurality of pillars, and a contact formed in the bottom source/drain, between the plurality of pillars.

In another aspect, a 4F2 vertical DRAM transistor may include a plurality of pillars extending from a base layer of a substrate, a gate formed around the plurality of pillars, and a N+ doped buried bitline formed within the base layer, wherein an upper surface of the N+ doped buried bitline is recessed below an upper surface of the base. The 4F2 vertical DRAM transistor may further include a bottom source/drain formed beneath the plurality of pillars, and a N++ doped contact formed in the bottom source/drain, between the plurality of pillars.

In yet another aspect, a method of forming a dynamic random-access memory device may include forming a plurality of pillars from a base of a substrate, forming a sacrificial layer over the plurality of pillars, and forming a buried bitline in the base by directing ions into the base while the substrate is at a temperature below 0° C., wherein an upper surface of the buried bitline is recessed below an upper surface of the base. The method may further include forming a gate around the plurality of pillars, etching the base and the buried bitline to form a recess below the plurality of pillars, forming a bottom source/drain within the recess, and forming a contact in the recess by directing ions into the bottom source/drain while the substrate is at a temperature below 0° C.

BRIEF DESCRIPTION OF THE DRAWINGS

The accompanying drawings illustrate exemplary approaches of the disclosure, including the practical application of the principles thereof, as follows.

Figure 2:
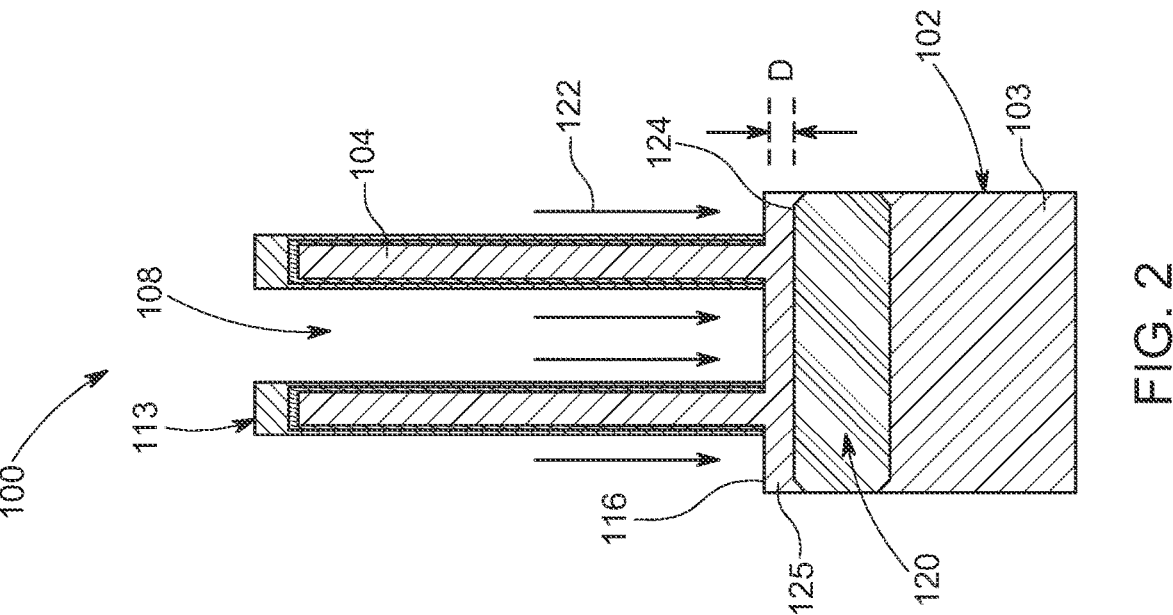
FIG. 2 illustrates a side cross-sectional view of the device following a low-temperature ion implant, according to embodiments of the present disclosure.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Devices, DRAM transistors, and methods in accordance with the present disclosure will now be described more fully hereinafter with reference to the accompanying drawings, where various embodiments are shown. The devices, DRAM transistors, and methods may be embodied in many different forms and are not to be construed as being limited to the embodiments set forth herein. Instead, these embodiments are provided so the disclosure will be thorough and complete, and will fully convey the scope of the methods to those skilled in the art.

To address the deficiencies of the prior art described above, including floating body effect and high common bitline resistance, disclosed herein are methods and devices (e.g., 4F2 vertical DRAM transistors) including a buried bitline formed using a low-temperature ion implant (e.g., heavy N+ dopant) and a contact formed using another low-temperature ion implant (e.g., heavy N++ dopant). In some embodiments, the contact is formed in a bottom silicon-germanium (SiGe) source/drain (S/D), wherein the bottom narrow band-gap SiGe S/D is formed last to reduce the back injection efficiency of the parasitic bipolar junction transistor (BJT), thus offering a floating body-free device. Furthermore, using a heavy N+ doped buried bitline spaced apart from channel avoids uncontrolled thermal diffusion of the bottom S/D, with the benefit of lower contact resistance.

Figure 1:
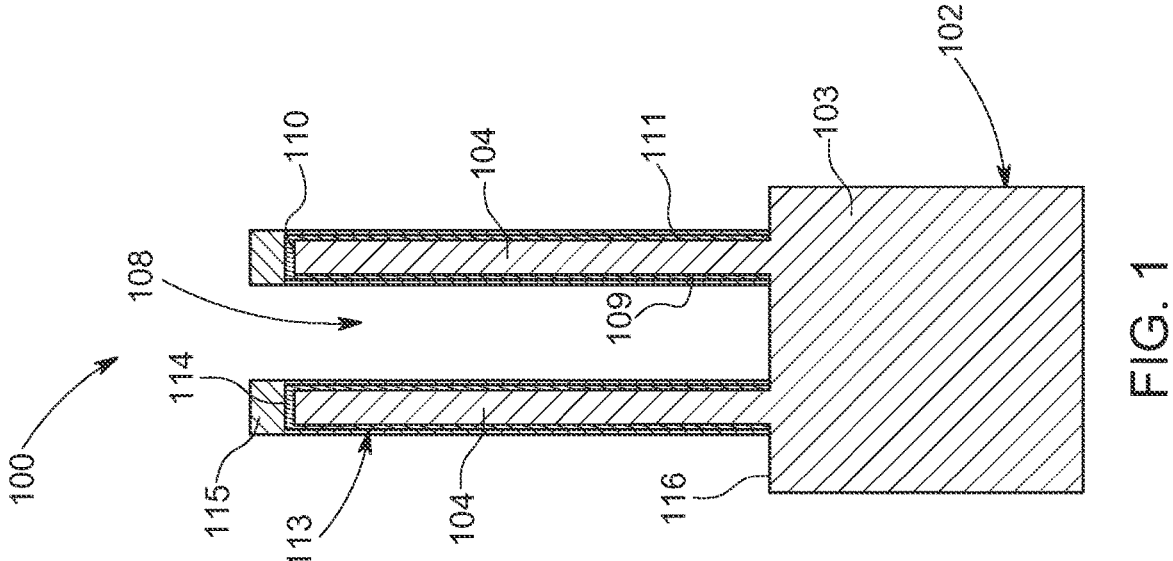
FIG. 1 illustrates a side cross-sectional view of a device, such as a DRAM device, including a plurality of pillars, according to embodiments of the present disclosure.

FIG. 1 illustrates a side cross-sectional view of a device 100, such as a DRAM device, which may be a 4F2 vertical DRAM transistor. As shown, the device 100 may include a substrate 102 having a base 103, and a plurality of pillars 104 extending vertically from the base 103. Although non-limiting, the plurality of pillars 104 may each have a cylindrical shape defined by a sidewall 106 and an upper surface 110. The sidewall 106 may include an inner portion 109 opposite an exterior portion 111. The plurality of pillars 104 may further define a central trench 108 extending therebetween. Although only two (2) pillars 104 are shown for the sake of simplicity, it will be appreciated that a much greater number of pillars 104 may be present across the device 100.

As further shown, a sacrificial layer 113 may be formed over each of the pillars 104, including along the sidewall 106 and the upper surface 110. In some embodiments, the sacrificial layer 113 may include a silicon oxide 114 formed over the exposed sidewall 106 and upper surface 110, and a silicon nitride 115 formed over the silicon oxide 114. It will be appreciated that other materials are possible in alternative examples. In some embodiments, the sacrificial layer 113 does not remain along an upper surface 116 of the base 103 of the substrate 102.

As shown in FIG. 2, a buried bitline 120 may be formed in the base 103 of the substrate 102 by directing ions into the upper surface 116 of the base 103 using a low-temperature implant 122. Low-temperature in the context of the present disclosure may mean temperatures between approximately 0 and −100° C. In some embodiments, the low-temperature implant may be performed at less than −100° C.

The low-temperature implant 122 may include N+ doping and a high temperature anneal to drive in the dopant. As shown, the buried bitline 120 may be embedded within the base 103 such that an upper surface 124 of the buried bitline 120 is located below the upper surface 116 of the base. Said differently, a portion 125 of the base 103 may remain between the buried bitline 120 and the pillars 104, wherein the portion 125 may be defined by a height or depth, 'D'. As will be explained in further detail herein, the N+ doped buried bitline 120 is maintained away from the pillars 104 and the channel area to avoid uncontrolled thermal diffusion of a subsequently formed lightly doped drain (LDD) due to downstream multiple thermal processes.

In some embodiments, the low-temperature implant 122 may be performed over a series of successive implants whereby ions (e.g., P+, As+, Sb+) are directed into the upper surface 116 of the base 103 at a given energy, e.g., between 7 keV and 35 keV, 3E15. Embodiments of the disclosure are not limited to any particular implant energy or number of implant steps, however. As shown, the implant angle may be perpendicular, or approximately perpendicular, to a plane defined by the top surface 116 of the base 103.

The low-temperature implant 122 may be performed while the substrate 102 is at a low temperature. Said differently, the ions may be delivered as part of a cryogenic ion implant process, which is performed between 0 and −100 degrees C. In some embodiments, the cryogenic ion implant includes chilling a platen or substrate holder (not shown) upon which the substrate 102 is provided. The low-temperature ion implant enables higher-dose doping, which lowers defect levels.

Although not shown, following the low-temperature implant 122, the device 100 may be annealed to reduce residue defects. In some embodiments, the anneal is a thermal anneal performed at a temperature between 650 C and 950 C for a specific period of time (e.g., 60 s) in inert N2 ambient at atmospheric pressure. The anneal temperature, time, and/or ambient may be changed based on device requirements.

Figure 3:
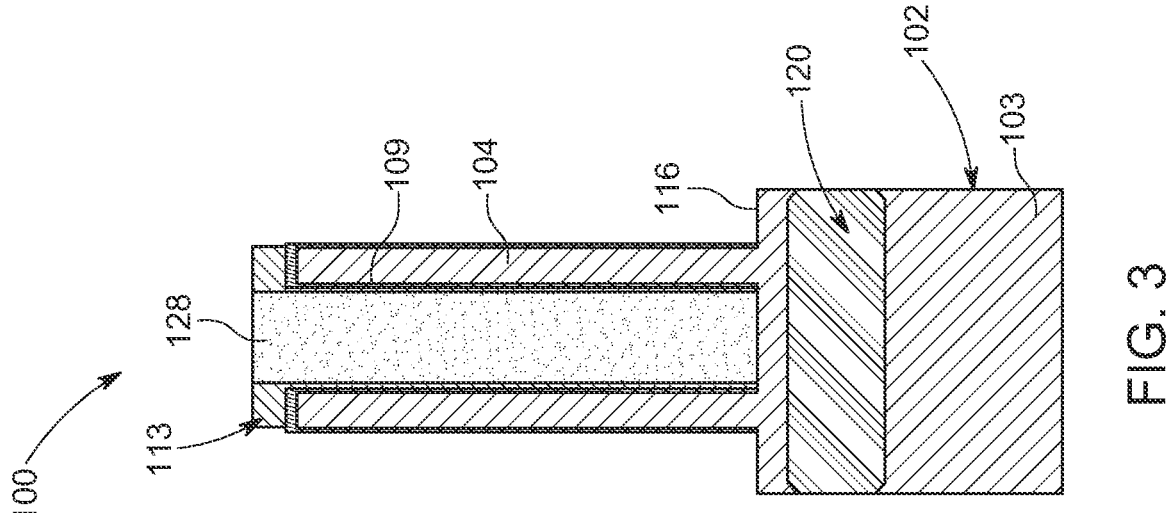
FIG. 3 illustrates a side cross-sectional view of the device following formation of a sacrificial fill, according to embodiments of the present disclosure.

FIG. 3 demonstrates deposition of a sacrificial fill 128 between the pillars 104. As shown, the sacrificial fill 128 may be formed directly atop the upper surface 116 of the base 103 of the substrate 102. As further shown, the sacrificial fill 128, which may be SiO₂ or C, is also in direct contact with the sacrificial layer 113 formed along the inner portion 109 of the pillars 104.

Figure 4:
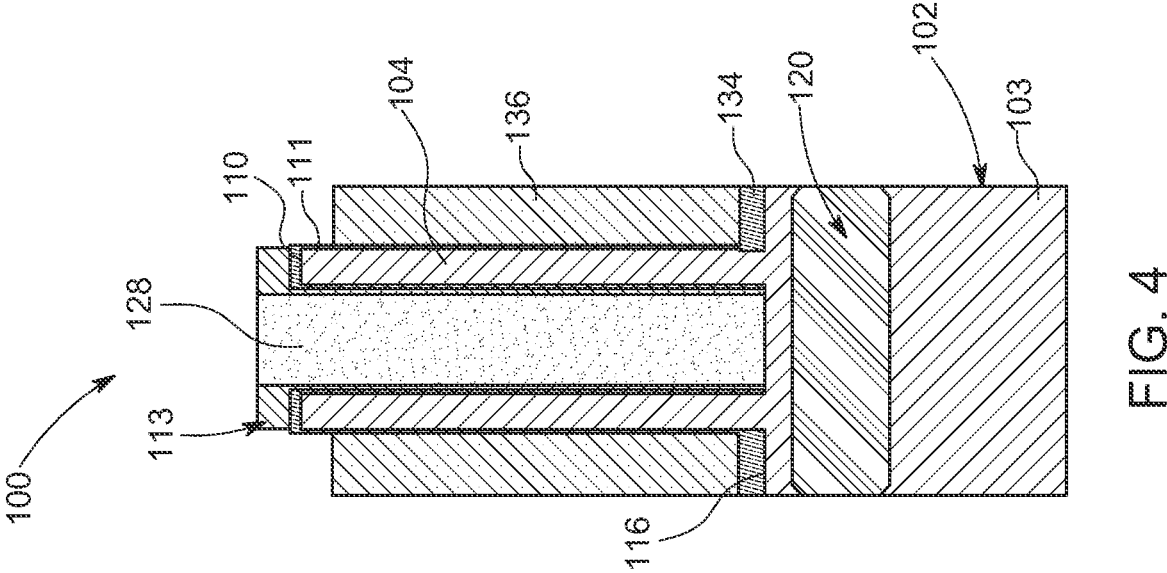
FIG. 4 illustrates a side cross-sectional view of the device following formation of a gate, according to embodiments of the present disclosure.

As shown in FIG. 4, a portion of the sacrificial layer 113 may be removed from the exterior 111 of the pillars 104, and a bottom spacer 134 may be formed atop the upper surface 116 of the base 103. A gate oxide (not shown) may then be formed over the bottom spacer 134, followed by gate 136. In some embodiments, the gate 136 may be recessed below the upper surface 110 of the pillars 104.

Figure 6:
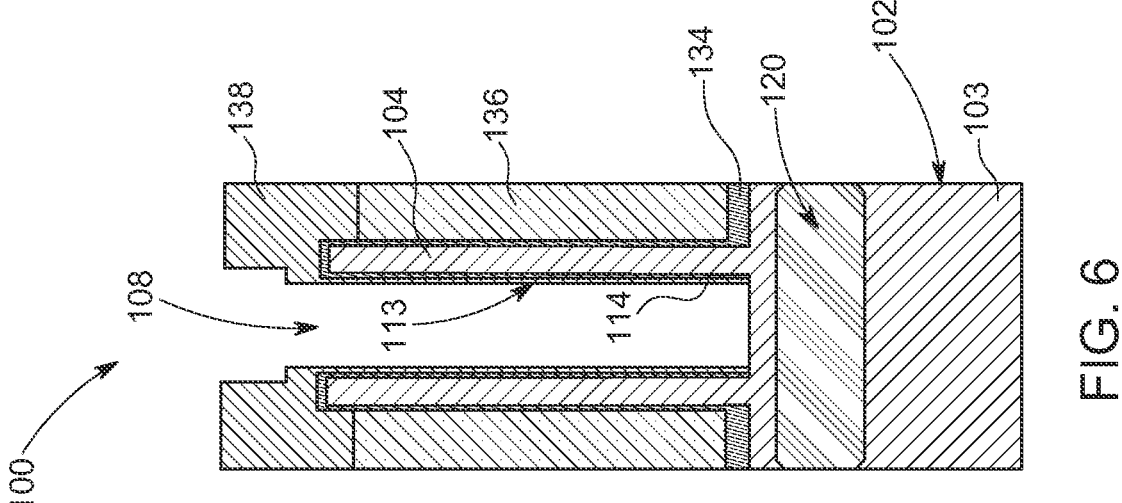
FIG. 6 illustrates a side cross-sectional view of the device following removal of the sacrificial fill, according to embodiments of the present disclosure.
Figure 5:
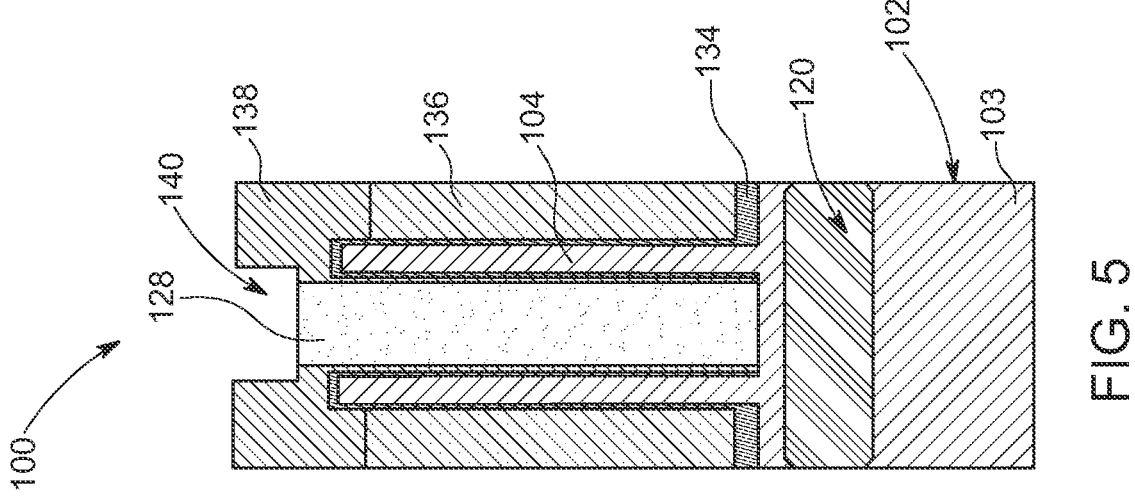
FIG. 5 illustrates a side cross-sectional view of the device following hardmask deposition and patterning, according to embodiments of the present disclosure.

Next, as shown in FIG. 5, a hardmask 138 may be deposited over the pillars 104 and over the gate 136, and an opening 140 may be formed through hardmask 138 to expose the sacrificial fill 128. The sacrificial fill 128 may then be removed (e.g., etched), as shown in FIG. 6, to expose the upper surface 116 of the base 103 within the central trench 108. The etch may be selective to the silicon nitride 115 of the sacrificial layer 113 along the pillars 104.

Figure 7:
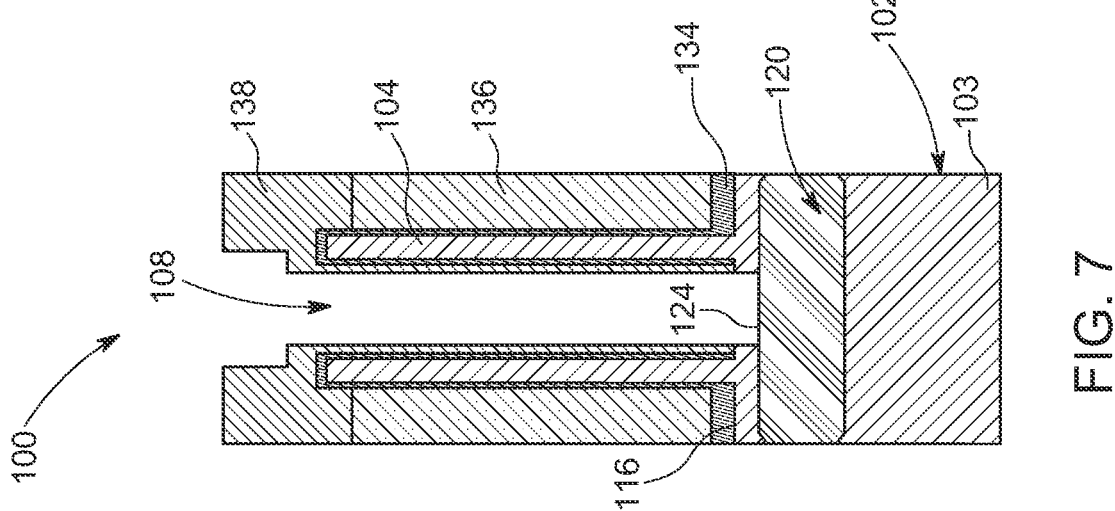
FIG. 7 illustrates a side cross-sectional view of the device following an etch process, according to embodiments of the present disclosure.

As shown in FIG. 7, a first etch may then be performed to recess the upper surface 116 of the base 103 within the central trench 108. The etch may expose the upper surface 124 of the buried bitline 120, between the pillars 104. In some embodiments, the first etch may be a directional reactive ion etch (RIE).

Figure 8:
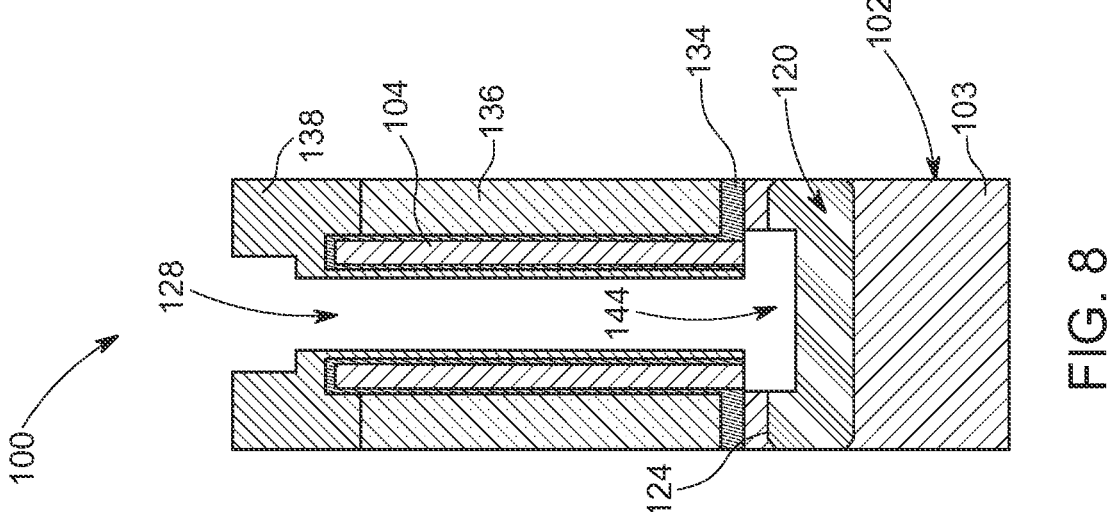
FIG. 8 illustrates a side cross-sectional view of the device following an etch process to form a recess, according to embodiments of the present disclosure.

As shown in FIG. 8, a second etch may then be performed to form a recess 144 below the pillars 104. As shown, the recess 144 may be formed in the base 103 and the buried bitline 120. In various embodiments, the second etch may be wet or dry etch operable to remove the base 103 and the buried bitline 120 both vertically and horizontally. As shown, the recess 144 may generally extend horizontally beneath the pillars 104 to an inner edge of the bottom spacer 134.

Figure 9:
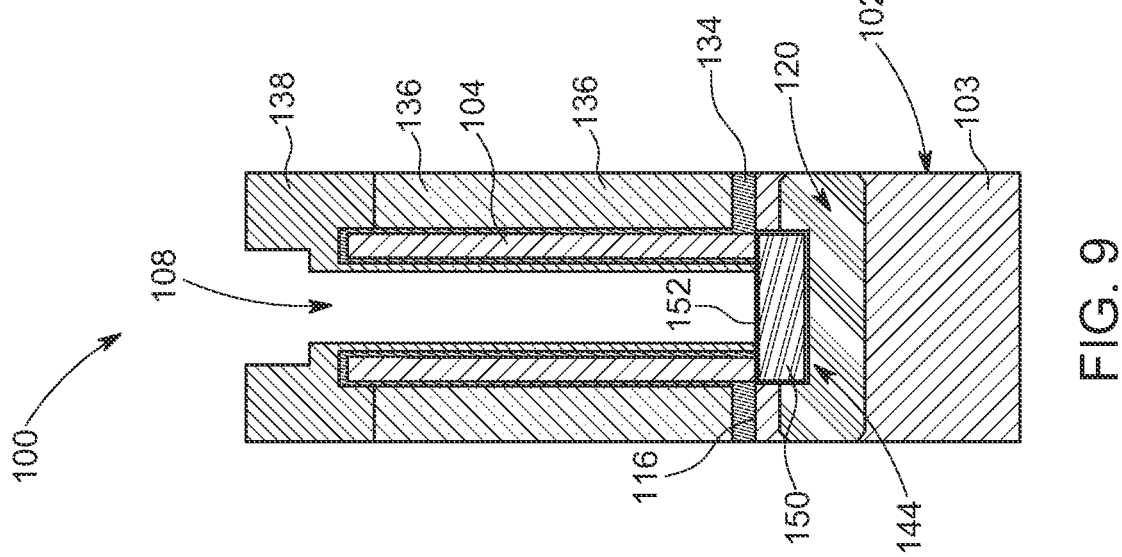
FIG. 9 illustrates a side cross-sectional view of the device following formation of a bottom source/drain, according to embodiments of the present disclosure.

As shown in FIG. 9, a bottom S/D 150 may then be formed within the recess 144. In some embodiments, the bottom S/D 150 may be a lightly doped drain (LDD) including SiGe, which is epitaxially grown within the recess 144. This SiGe-last process reduces potential floating-body effect by bandgap engineering. As shown, the bottom S/D 150 may extend beneath the pillars 104 to fill the recess 144, and may be formed partially within the buried bitline 120. Although non-limiting, an upper surface 152 of the bottom S/D 150 may co-planar with the upper surface 116 of the base 103.

Figure 10:
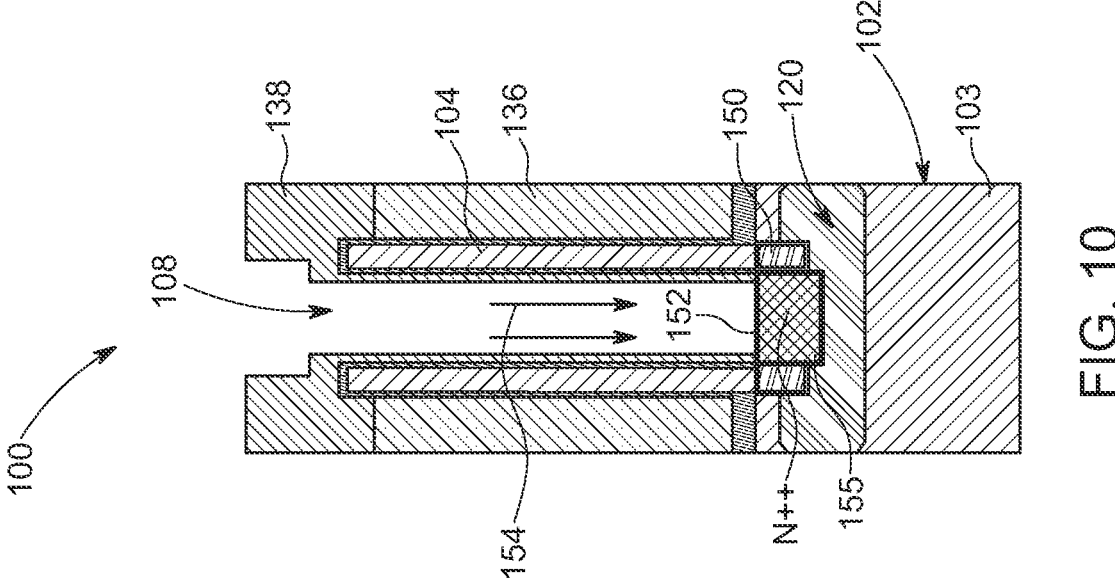
FIG. 10 illustrates a side cross-sectional view of the device following a low-temperature ion implant to form a contact, according to embodiments of the present disclosure.

As shown in FIG. 10, with the upper surface 152 of the bottom S/D 150 exposed, a contact 155 may be formed in the device 100 by directing ions into the upper surface 152 of the bottom S/D 150 using a low-temperature (e.g., 0 and −100° C.) implant 154. As shown, the low-temperature implant 154 may be performed through the central channel 108, wherein the sacrificial layer 113 protects the pillars 104. The low-temperature implant 154 beneficially reduces damage while providing good angle control. The contact 155 may be N++ doped, and may extend partially into the buried bitline 120, as shown. In this embodiment, the dopant concentration of the contact 155 may be higher than the dopant concentration of the buried bitline 120 (N+) to further reduce contact resistance.

Figure 11:
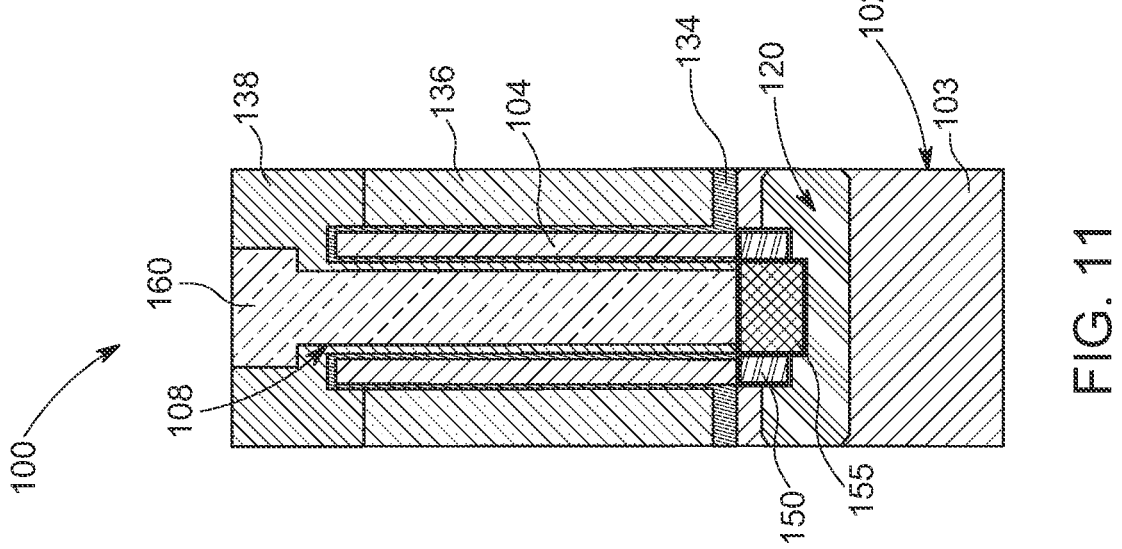
FIG. 11 illustrates a side cross-sectional view of the device following formation of a dielectric fill, according to embodiments of the present disclosure.

As shown in FIG. 11, a dielectric fill 160 may be formed within the central channel 108 and then planarized. As shown, the dielectric fill 160 may be formed directly atop the contact 155.

Figure 12:
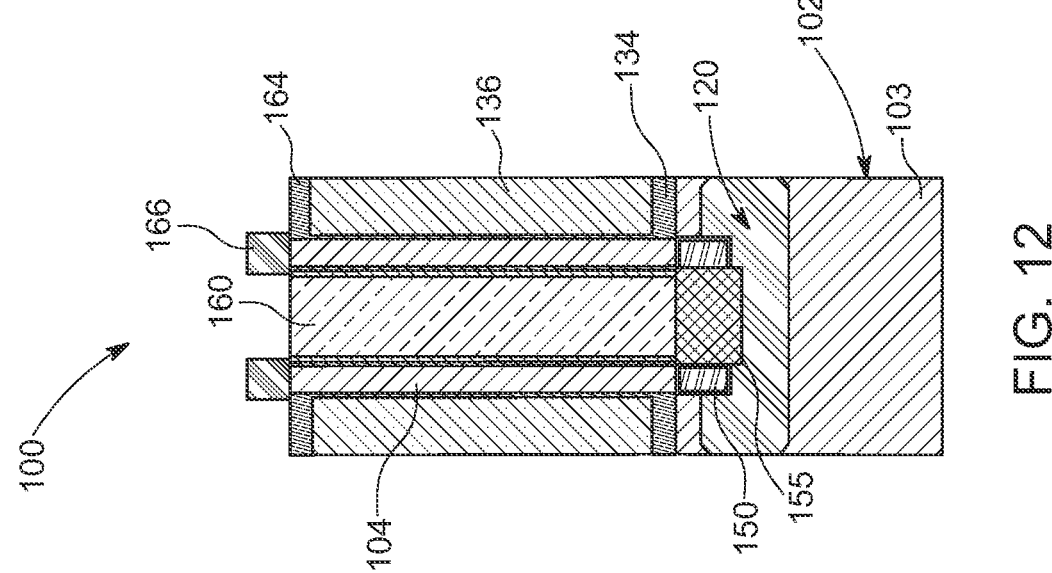
FIG. 12 illustrates a side cross-sectional view of the device following formation of an upper source/drain, according to embodiments of the present disclosure.

The hardmask 138 may then be removed from over the pillars 104 and the gate 136, and the dielectric fill 160 may be recessed to expose an upper portion of the pillars 104, as shown in FIG. 12. In some embodiments, a SiO2 spacer 164 may be formed over the gate 136. As further shown, the exposed portion of the pillars 104 may be doped to form upper S/D 166 within each of the pillars 104.

Figure 13:
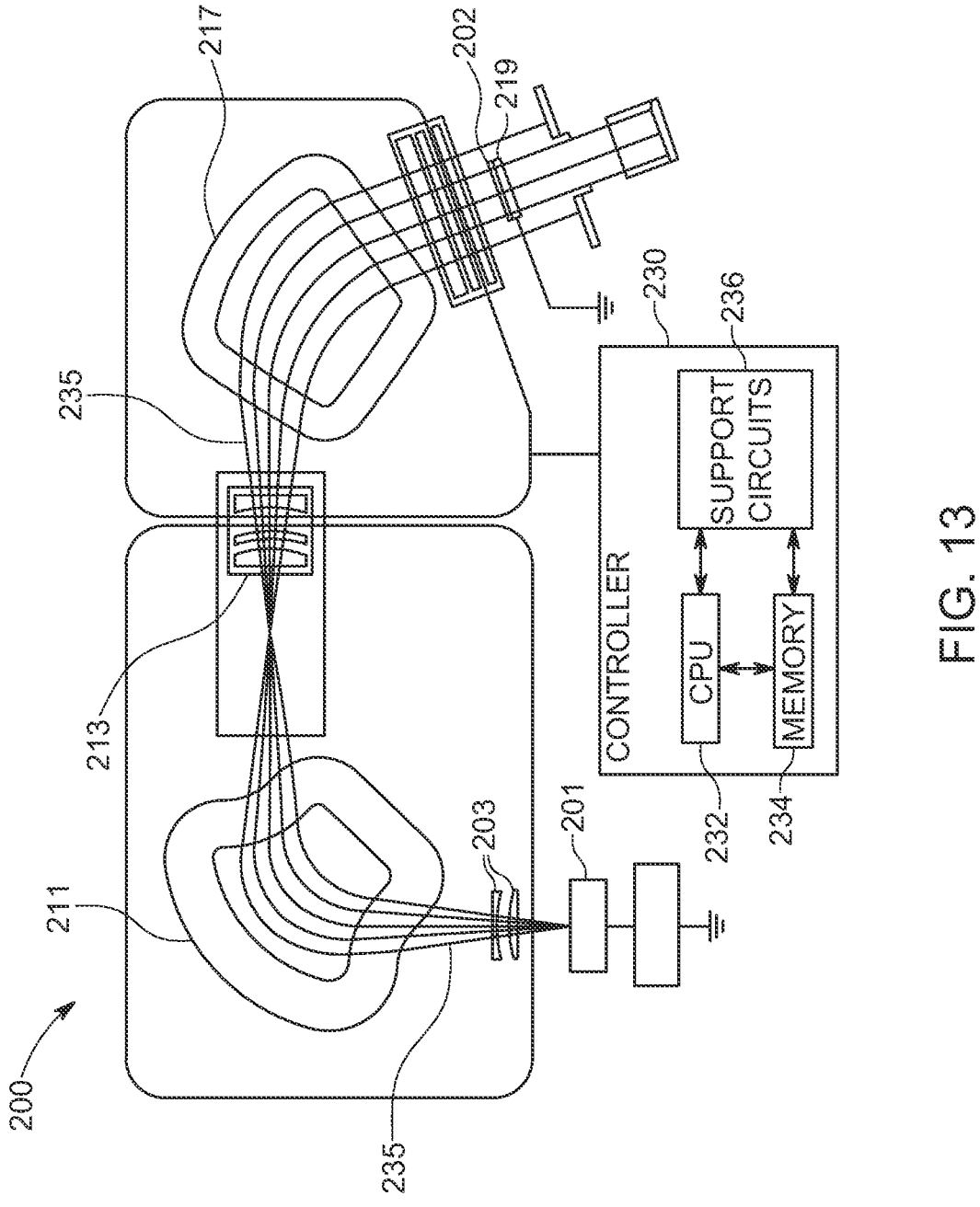
FIG. 13 illustrates a diagram of a processing apparatus according to embodiments of the present disclosure.

FIG. 13 illustrates a schematic diagram of a processing apparatus 200 useful to perform processes described herein. One example of a beam-line ion implantation processing apparatus is the Varian VIISTA® Trident, available from Applied Materials Inc., Santa Clara, CA. The processing apparatus 200 may include an ion source 201 for generating ions. For example, the ion source 201 may provide an ion implant, such as low-temperature ion implant 122 demonstrated in FIG. 2 and low-temperature ion implant 154 demonstrated in FIG. 10.

The processing apparatus 200 may also include a series of beam-line components. Examples of beam-line components may include extraction electrodes 203, a magnetic mass analyzer 211, a plurality of lenses 213, and a beam parallelizer 217. The processing apparatus 200 may also include a platen 219 for supporting a substrate 202 to be processed. The substrate 202 may be the same as the substrate 102 described above. The substrate 202 may be moved in one or more dimensions (e.g., translate, rotate, tilt, etc.) by a platform component sometimes referred to as a "roplat" (not shown). It is also contemplated that the platen 219 may be configured to perform the heated implantation processes described herein to modify one or more waveguide surfaces.

In operation, ions of the desired species, for example, dopant ions, are generated and extracted from the ion source 201. Thereafter, the extracted ions 235 travel in a beam-like state along the beam-line components and may be implanted in the substrate 202. Similar to a series of optical lenses that manipulate a light beam, the beam-line components manipulate the extracted ions 235 along the ion beam. In such a manner, the extracted ions 235 are manipulated by the beam-line components while the extracted ions 235 are directed toward the substrate 202. It is contemplated that the apparatus 200 may provide for improved mass selection to implant desired ions while reducing the probability of undesirable ions (impurities) being implanted in the substrate 202.

In some embodiments, the processing apparatus 200 can be controlled by a processor-based system controller such as controller 230. For example, the controller 230 may be configured to control beam-line components and processing parameters associated with beam-line ion implantation processes. The controller 230 may include a programmable central processing unit (CPU) 232 that is operable with a memory 234 and a mass storage device, an input control unit, and a display unit (not shown), such as power supplies, clocks, cache, input/output (I/O) circuits, and the like, coupled to the various components of the processing apparatus 200 to facilitate control of the substrate processing. The controller 230 also includes hardware for monitoring substrate processing through sensors in the processing apparatus 200, including sensors monitoring the substrate position and sensors configured to receive feedback from and control a heating apparatus coupled to the processing apparatus 200. Other sensors that measure system parameters such as substrate temperature and the like, may also provide information to the controller 230.

To facilitate control of the processing apparatus 200 described above, the CPU 232 may be one of any form of general-purpose computer processor that can be used in an industrial setting, such as a programmable logic controller (PLC), for controlling various chambers and sub-processors. The memory 234 is coupled to the CPU 232 and the memory 234 is non-transitory and may be one or more of readily available memory such as random access memory (RAM), read only memory (ROM), floppy disk drive, hard disk, or any other form of digital storage, local or remote. Support circuits 236 may be coupled to the CPU 232 for supporting the processor in a conventional manner. Implantation and other processes are generally stored in the memory 234, typically as a software routine. The software routine may also be stored and/or executed by a second CPU (not shown) that is remotely located from the hardware being controlled by the CPU 232.

The memory 234 is in the form of computer-readable storage media that contains instructions, that when executed by the CPU 232, facilitates the operation of the apparatus 200. The instructions in the memory 234 are in the form of a program product such as a program that implements the method of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

It is to be understood that the various layers, structures, and regions shown in the accompanying drawings are schematic illustrations. For ease of explanation, one or more layers, structures, and regions of a type commonly used to form semiconductor devices or structures may not be explicitly shown in a given drawing. This does not imply that any layers, structures, and/or regions not explicitly shown are omitted from the actual semiconductor structures.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including yet not limited to, for example: chemical vapor deposition (CVD), low-pressure CVD (LPCVD), and plasma-enhanced CVD (PECVD). Additional techniques may include semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), and sputtering deposition. Additional techniques may include ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A dynamic random-access memory device, comprising:
a plurality of pillars extending from a base;
a gate formed around the plurality of pillars;
a buried bitline formed within the base, wherein an upper surface of the buried bitline is recessed below an upper surface of the base;
a bottom source/drain formed beneath the plurality of pillars, wherein the bottom source/drain is formed partially within a recess of the buried bitline; and
a contact formed in the bottom source/drain, between the plurality of pillars.

2. The dynamic random-access memory device of claim 1, further comprising an upper source/drain formed in the plurality of pillars.

3. The dynamic random-access memory device of claim 1, further comprising a dielectric fill formed over the contact, between the plurality of pillars.

4. The dynamic random-access memory device of claim 1, wherein the bottom source/drain is silicon germanium, wherein the contact is N++ doped, and wherein the buried bitline is N+ doped.

5. The dynamic random-access memory device of claim 1, wherein the gate comprises a spacer layer formed atop the upper surface of the base.

6. The dynamic random-access memory device of claim 1, further comprising a sacrificial layer formed along an inner surface of the plurality of pillars.

7. The dynamic random-access memory device of claim 1, further comprising a SiO2 spacer formed over the gate.

8. A 4F2 vertical DRAM transistor, comprising:
a plurality of pillars extending from a base of a substrate;
a gate formed around the plurality of pillars;
a N+ doped buried bitline formed within the base, wherein an upper surface of the N+ doped buried bitline is recessed below an upper surface of the base;
a bottom source/drain formed beneath the plurality of pillars, wherein the bottom source/drain is formed partially within a recess of the buried bitline; and
a N++ doped contact formed in the bottom source/drain, between the plurality of pillars.

9. The 4F2 vertical DRAM transistor of claim 8, further comprising an upper source/drain formed in the plurality of pillars.

10. The 4F2 vertical DRAM transistor of claim 8, further comprising a dielectric fill formed over the contact, between the plurality of pillars.

11. The 4F2 vertical DRAM transistor of claim 8, wherein the bottom source/drain is silicon germanium.

12. The 4F2 vertical DRAM transistor of claim 8, further comprising a sacrificial layer formed along an inner surface of the plurality of pillars.

* * * * *